United States Patent
Scheikl et al.

(10) Patent No.: US 7,715,160 B2
(45) Date of Patent: May 11, 2010

(54) MONITORING A LOAD DRIVEN BY A POWER SEMICONDUCTOR SWITCH

(75) Inventors: Erich Scheikl, Villach (AT); Alberto Zanardi, Latschach (AT)

(73) Assignee: Infineon Technologies AG, Neubiberg (DE)

( * ) Notice: Subject to any disclaimer, the term of this patent is extended or adjusted under 35 U.S.C. 154(b) by 379 days.

(21) Appl. No.: 11/926,860

(22) Filed: Oct. 29, 2007

(65) Prior Publication Data

US 2009/0109586 A1 Apr. 30, 2009

(51) Int. Cl.
*H02H 3/26* (2006.01)
(52) U.S. Cl. .......................... 361/86; 361/87
(58) Field of Classification Search ................... 361/86, 361/87, 93.7–93.9
See application file for complete search history.

(56) References Cited

U.S. PATENT DOCUMENTS 6,594,129 B1* 7/2003 Baba et al. .................... 361/87

2009/0027096 A1* 1/2009 Mourrier et al. ............ 327/170

FOREIGN PATENT DOCUMENTS

| DE | 19723456 | 12/1998 |
|---|---|---|
| DE | 10244266 | 3/2004 |
| EP | 0287919 | 4/1988 |

OTHER PUBLICATIONS

Office Action in DE 102008051074.2-35 dated Nov. 10, 2009.

* cited by examiner

*Primary Examiner*—Danny Nguyen
(74) *Attorney, Agent, or Firm*—Banner & Witcoff, Ltd

(57) ABSTRACT

A method and an apparatus for monitoring a load driven by a power semiconductor switch. The method may comprise, for example: driving a control electrode of the power semiconductor switch, in such a way that a rise in the load current through the power semiconductor switch is effected after a delay time; generating a diagnostic current flowing through the load, wherein the diagnostic current brings about a voltage drop across the load before the delay time has elapsed; and evaluating the voltage drop across the load before the delay time has elapsed.

23 Claims, 5 Drawing Sheets

MONITORING A LOAD DRIVEN BY A POWER SEMICONDUCTOR SWITCH

BACKGROUND

In many applications it is necessary to monitor the load driven by a power semiconductor switch, in order to be able to prevent damage or destruction of the power semiconductor switch. Particularly if the load is short-circuited (for example on account of a defect), the magnitude of the impedance of the driven load is very small, which can in turn lead to an overloading of the power semiconductor switch. Such an overloading can lead for example to a local overheating of the semiconductor body in which the power semiconductor switch is integrated, whereby undesirable thermal stresses arise in the semiconductor body. Thermally induced stresses in the semiconductor body can directly destroy the latter if the stress amplitude is high enough. Even when the stress amplitudes are relatively small, however, fatigue of the semiconductor material can occur, which leads to a shortening of the lifetime of the semiconductor switch.

For this reason, in known drive circuits for driving a load with a power semiconductor switch, e.g. a power metal-oxide semiconductor field-effect transistor (MOSFET), during a period of time in which the power semiconductor switch is switched off and no load current flows, a check is made at the load with the aid of a diagnostic current to ascertain whether the (ohmic) resistance of the load lies within a predetermined permissible interval. If the ohmic resistance is too low, then a short circuit is possibly present and the power semiconductor switch can be prevented from being switched on.

This method of monitoring the load consumes electrical power corresponding to the product of the diagnostic current and the resistance of the load. In many applications this power consumption in the OFF state of the power semiconductor switch is undesirable, however, since, with the power semiconductor switch switched off, the entire drive circuit for the load is intended to be put into a state of extremely low power consumption ("low power consumption mode"). However, this state of extremely low power consumption is incompatible with the power consumption during the resistance measurement by means of a diagnostic current in the OFF state of the power semiconductor switch.

In the switched-on state there is generally no requirement for restricting the power consumption. However, if the resistance measurement is carried out in the switched-on state at the load, an impermissible overheating of the power semiconductor switch may already have occurred (e.g. in the case of a short circuit) before suitable countermeasures (e.g. switching off the load current) can be implemented. Even if destruction of the power semiconductor switch is prevented by timely switching off, the local overheating can nevertheless already bring about damage resulting in a shortened lifetime of the semiconductor switch.

Consequently, there is a need for a circuit arrangement for driving a power semiconductor switch which makes it possible to monitor the connected load and which takes account of restrictions of the power consumption in the switched-off state of the power semiconductor switch. Furthermore, there is a need for a method for monitoring a load driven by a power semiconductor switch which likewise meets the abovementioned boundary conditions.

SUMMARY

One example of an aspect of the invention relates to a method for monitoring a load driven by a power semiconductor switch. The method comprises: driving a control electrode of the power semiconductor switch, in such a way that a rise in the load current through the power semiconductor switch is effected after a delay time; generating a diagnostic current flowing through the load, wherein the diagnostic current brings about a voltage drop across the load before the delay time has elapsed; and evaluating the voltage drop across the load before the delay time has elapsed.

The evaluation may include, for example, comparing the voltage drop with a threshold value.

A further example of an aspect of the invention relates to a circuit arrangement for driving a power semiconductor switch. The circuit arrangement comprises: a power semiconductor switch connected to a load and further having a load path, which is connected in series with the load, and having a control electrode; a driver circuit connected to the control electrode and configured to drive the control electrode depending on a control signal in such a way that a delay time elapses between the application of a driver signal to the control electrode and the rise in a load current through the load path of the power semiconductor switch; and a monitoring circuit configured to generate a diagnostic current through the load and evaluate the voltage drop across the load before the delay time has elapsed.

The monitoring circuit may have, for example, a current source for generating the diagnostic current. It may furthermore have a comparator in order to compare the voltage drop with a threshold value.

These and other aspects will be described herein in connection with various illustrative embodiments described in the Detailed Description and with reference to the various figures.

BRIEF DESCRIPTION OF THE FIGURES

The following figures and the further description are intended to assist in understanding the invention better. The elements illustrated in the figures should not be understood as restrictive. Rather, to the drawings are merely for illustrating aspects of the invention. Furthermore, circuit components not necessary for understanding the invention are not always illustrated in the figures. In the figures, identical reference symbols designate corresponding parts.

DETAILED DESCRIPTION OF THE FIGURES

Figure 1:
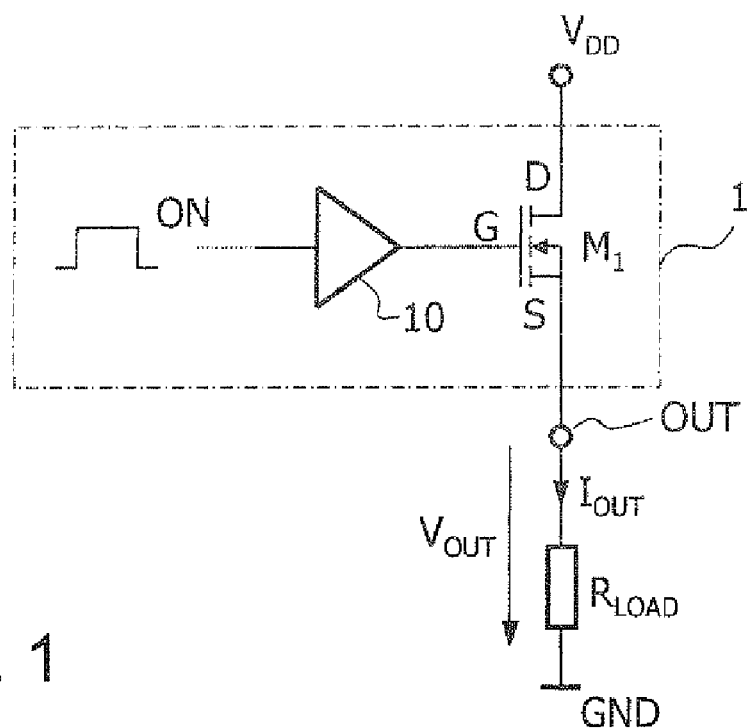
FIG. 1 shows a conventional circuit arrangement for switching a load with a power semiconductor switch in a configuration as a high-side switch.

FIG. 1 shows a conventional circuit arrangement 1 for driving a load $R_{LOAD}$ with the aid of a power semiconductor switch $M_1$. The semiconductor switch $M_1$ illustrated is a power MOSFET in a high-side configuration. However, the principle described can, of course, also be applied to low-side switches and also to other types of semiconductor switches, e.g. insulated-gate bipolar transistors (IGBTs).

The semiconductor switch formed as a MOSFET in the present example has a gate terminal G as control terminal, and a drain terminal D and a source terminal S as load terminals. A load path of the MOSFET is formed by the drain-source path D-S in the example. The semiconductor switch $M_1$ illustrated is connected between a supply potential terminal having the supply potential $V_{DD}$ and an output OUT. The control terminal is connected to an output of a driver circuit 10. The load $R_{LOAD}$ is connected between the output OUT of the circuit arrangement 1 and a reference potential terminal having a reference potential (e.g. ground potential GND), such that a series circuit formed by the load path D-S of the power semiconductor switch $M_1$ and the load $R_{LOAD}$ is present. A control signal ON is fed to the input of the driver circuit 10. The driver circuit 10 is designed to generate a driver signal dependent on the control signal ON, e.g. a gate current that is constant at least in sections, for driving the control electrode G of the power semiconductor switch $M_1$. With the transistor switched on, a load current $I_{OUT}$ flows through the load and thereby brings about a voltage drop $V_{OUT}$ dependent on the load current $I_{OUT}$ at the load $R_{LOAD}$.

Figure 2:
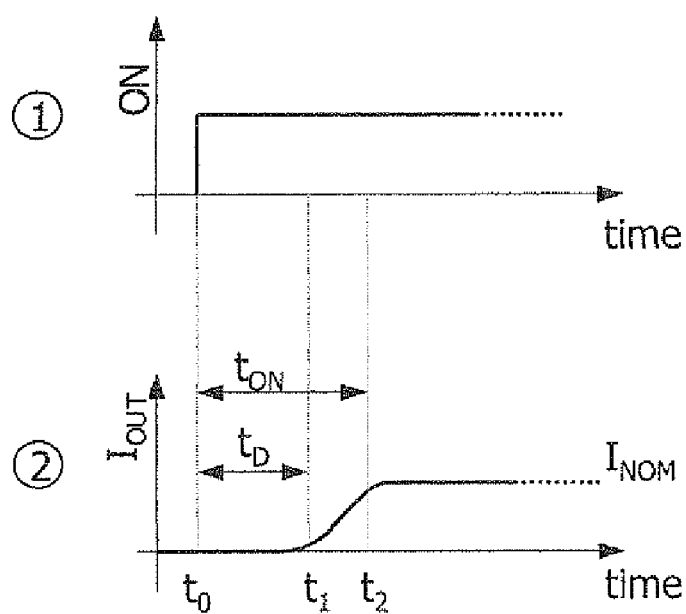
FIG. 2 shows, on the basis of timing diagrams, the signal profiles of the control signal and of the load current through the power semiconductor switch in a circuit arrangement according to FIG. 1.

A switch-on operation of the power semiconductor switch $M_1$ connected to the load $R_{LOAD}$ is illustrated on the basis of timing diagrams in FIG. 2. Before an instant $t_0$, the control signal ON has a switch-off level, a low level in the example, the driver circuit 10 therefore drives the power semiconductor switch $M_1$ in the off state, and the load current $I_{OUT}$ through the load path D-S of the power semiconductor switch $M_1$ or through the load $R_{LOAD}$ corresponds to a reverse current of almost zero (cf. diagram 2 of FIG. 2). At the instant $t_0$, the control signal ON changes to a switch-on level, a high level in the example, and thus initiates a switch-on operation of the power semiconductor switch $M_1$. The driver circuit 10 generates a corresponding driver signal for the control electrode G of the power semiconductor switch $M_1$, whereby electrical charge is stored on the control electrode. In this case, the electrical charge stored on the control electrode determines the switch state of the semiconductor switch $M_1$, the semiconductor switch $M_1$ undergoing transition from the off to the on state if the drive voltage (gate-source voltage), which is directly related to the stored electrical charge, exceeds the threshold voltage of the semiconductor switch. From the instant $t_0$ of the level change of the control signal ON, therefore, a delay time $t_D$ still elapses until the semiconductor switch M1 actually conducts and a rise in the load current $I_{OUT}$ is thus effected. After the delay time $t_D$ has elapsed, the load current $I_{OUT}$ rises with a virtually constant gradient between an instant $t_1$ and an instant $t_2$. At the instant $t_2$, the load current $I_{OUT}$ has approximately reached a nominal value $I_{NOM}$. The power semiconductor switch $M_1$ is now fully switched on and is in a state with low on-resistance. A time duration $t_2-t_0$ between reaching the nominal value $I_{NOM}$ and the level change of the control signal ON is also referred to as switch-on time $t_{ON}$.

The driver circuit 10 may be designed to generate a current $I_G$ as driver signal for the control electrode G. When a MOSFET is used as power semiconductor switch $M_1$, the gate electrode G is charged for example by a constant gate current $I_G$. The amplitude of the subsequent rise in the load current $I_{OUT}$ and thus also the electromagnetic emissions during a switching operation. The slope steepness of the load current rise can be limited by means of the amplitude of the gate current $I_G$ in order to limit the electromagnetic emissions to a permitted minimum amount. Since the control electrode G has a specific capacitance (in the case of a MOSFET the gate capacitance thereof), a specific time dependent on the capacitance is required in order to charge the control electrode to an extent such that the semiconductor switch switches on and a current flow through the load path D-S becomes possible. Consequently, the capacitance of the control electrode G essentially determines the delay time $t_D$. The capacitance of the control electrode G is governed by technology. A certain delay time $t_D$ is therefore always present during a switch-on operation.

A method for monitoring a load driven by a power semiconductor switch will now be explained as an example of aspects of the invention on the basis of the timing diagrams illustrated in FIG. 3.

Figure 3:
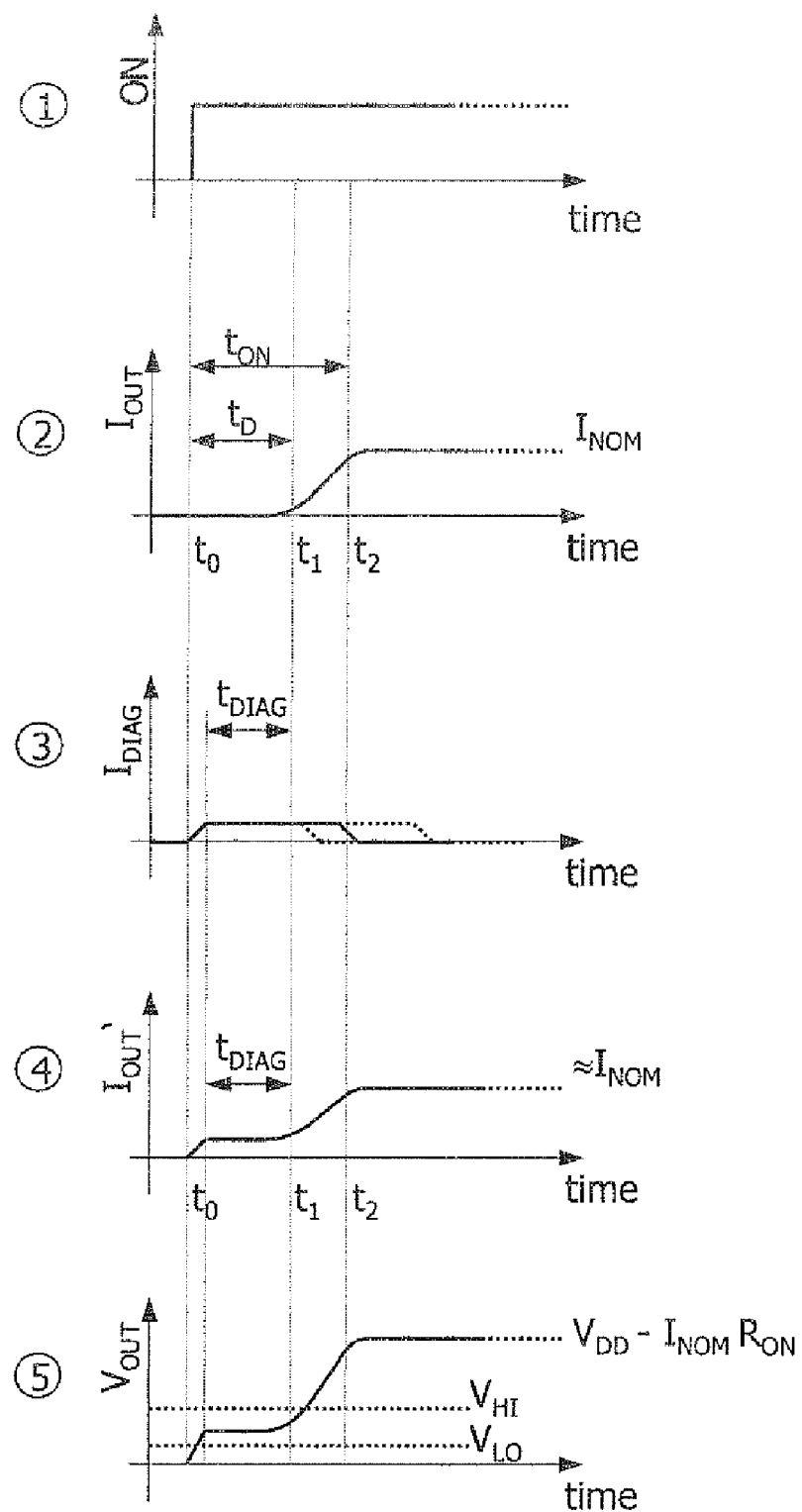
FIG. 3 shows, on the basis of signal profiles, an illustrative method for monitoring a load driven by a power semiconductor switch.

Diagrams 1 and 2 in FIG. 3 correspond to those in FIG. 2 and are illustrated in FIG. 3 in order to allow a direct comparison. As already explained in the description concerning FIG. 2, a level change of the control signal ON at an instant $t_0$ initiates a switch-on operation of the semiconductor switch $M_1$, but a rise in the load current $I_{OUT}$ is not effected until after a delay time $t_D$ at an instant $t_1$. In accordance with the method described in this example, provision is made, after the level change of the control signal ON at the instant $t_0$ (for the case where a MOSFET is used as a semiconductor switch, therefore, after the beginning of the charging of the gate capacitance of the MOSFET) but before the delay time $t_D$ has elapsed, for feeding in a diagnostic current $I_{DIAG}$, which is small in relation to the nominal value $I_{NOM}$ of the load current, for the purpose of resistance measurement (cf diagram 3 in FIG. 3). On account of the small magnitude of the diagnostic current of 0.5 mA to 10 mA, for example, it is possible to switch on the current very rapidly without generating appreciable electromagnetic emissions that could influence other electronic components. The diagnostic current $I_{DIAG}$ is superposed on the load current $I_{OUT}$ through the semiconductor switch $M_1$ (cf. diagram 4 in FIG. 3), such that an actual current $I_{OUT}'=I_{OUT}+I_{DIAG}$ flows through the load $R_{LOAD}$, where the following holds true:

$$I_{DIAG}/I_{NOM} \ll 1 \text{ or } I_{NOM}+I_{DIAG} \approx I_{NOM} \tag{1}$$

The diagnostic current $I_{DIAG}$ is thereby negligible in comparison with the nominal value $I_{NOM}$ of the load current $I_{OUT}$. Diagram 4 in FIG. 3 is not true to scale for reasons of clarity.

Since the current $I_{OUT}$ through the semiconductor switch $M_1$ also begins to rise at the instant $t_1$, a period of time of $t_{DIAG} \leq t_1 - t_0$ remains for a voltage measurement at the load $R_{LOAD}$. From the voltage $V_{OUT}$ dropped across the load, given a known diagnostic current $I_{DIAG}$, it is possible to determine the (ohmic) resistance $R_{LOAD} = V_{OUT}/I_{DIAG}$ of the load. In the present case, therefore, the resistance of the load $R_{LOAD}$ is proportional to the voltage drop $V_{OUT}$ at the load.

In order to check whether the resistance of the load $R_{LOAD}$ lies in a specific permissible interval, the value of the voltage $V_{OUT}$ does not actually have to be measured. A simpler evaluation suffices, e.g. checking whether the output voltage $V_{OUT}$ lies in the interval $[V_{LO} \; V_{HI}]$, that is to say whether $$V_{OUT} \in [V_{LO}, V_{HI}] \tag{2}$$

holds true. In this case, $V_{LO}$ and $V_{HI}$ designate a first and a second threshold value, respectively. If the voltage drop $V_{OUT}$ across the load is less than the first threshold value $V_{LO}$, then the load $R_{LOAD}$ driven by the semiconductor switch $M_1$ is excessively small and there may possibly be a short circuit present in the load. If the voltage drop $V_{OUT}$ exceeds the second threshold value $V_{HI}$, then the load resistance $R_{LOAD}$ is excessively high, which may likewise indicate a defect of the load or of the terminal connection of the load. When a short circuit is identified, in response the power semiconductor $M_1$ can be switched off immediately, for example, before the load current $I_{OUT}$ has actually reached its nominal value $I_{NOM}$. An overheating of the power semiconductor switch $M_1$ may be thereby prevented in good time.

The above-described measurement or evaluation of the voltage drop across the load should be concluded before the rise in the load current $I_{OUT}$ since, after the instant $t_1$, the voltage drop $V_{OUT}$ is no longer dependent only on the diagnostic current $I_{DIAG}$, rather the voltage $V_{OUT}$ rises up to a value $V_{DD}-I_{NOM} \cdot R_{ON}$, where $R_{ON}$ denotes the bulk resistance of the semiconductor switch in the fully switched-on state, the so-called on-resistance. After the instant $t_1$, the diagnostic current $I_{DIAG}$ can be switched off again, though this is not absolutely necessary. However, the diagnostic current $I_{DIAG}$ should be switched off at the latest when the semiconductor switch $M_1$ is switched off.

Figure 4:
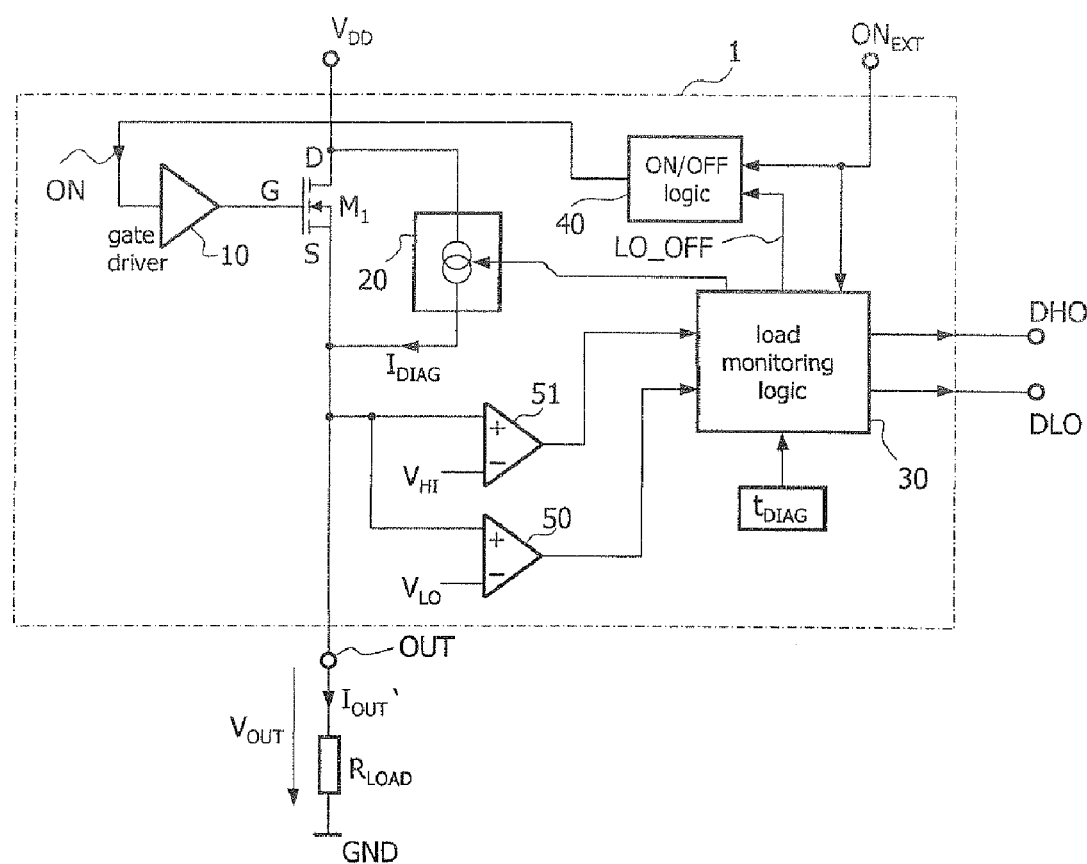
FIG. 4 shows an illustrative circuit arrangement for driving a power semiconductor switch with an illustrative monitoring circuit for monitoring a load driven by the power semiconductor switch.
Figure 5:
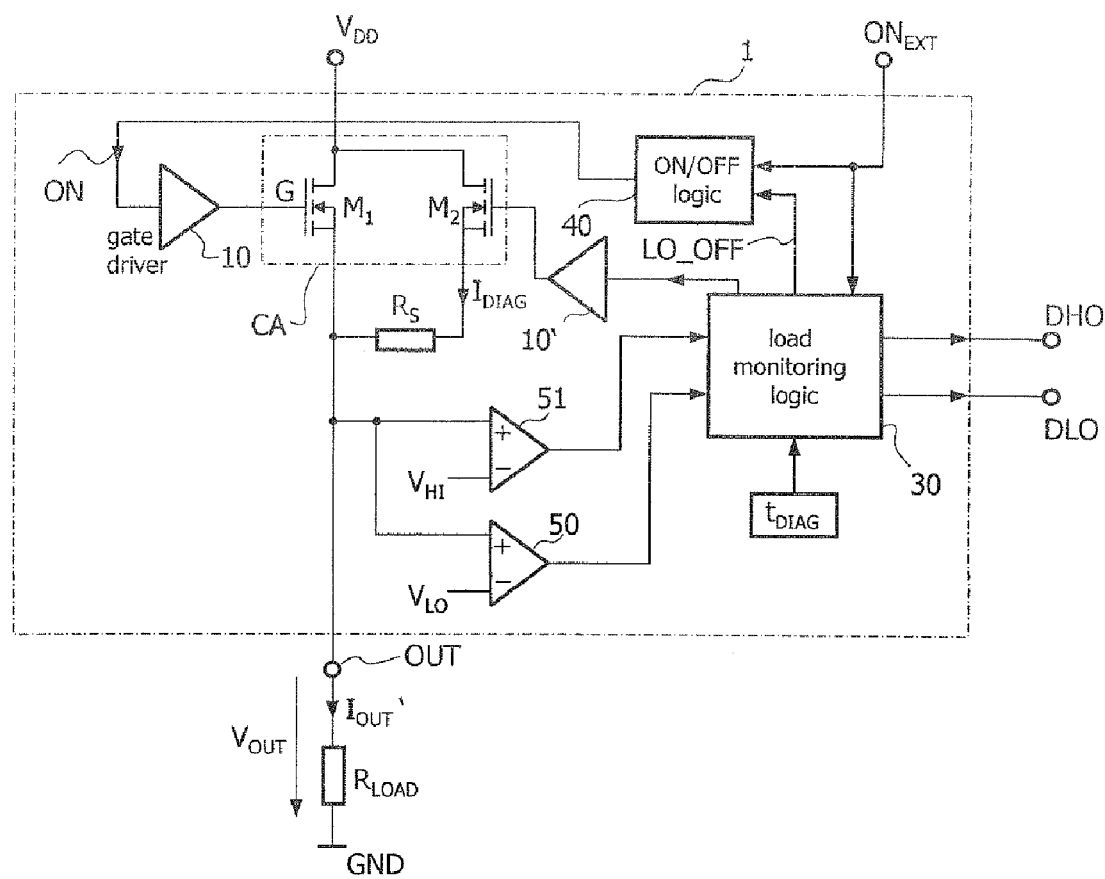
FIG. 5 shows an illustrative circuit arrangement which is modified by comparison with the circuit arrangement in accordance with FIG. 4.

FIGS. 4 and 5 show, as further examples of aspects of the invention, circuit arrangements 1 for driving a power semiconductor switch, which are designed to realize the method described above.

The circuit arrangement 1 in FIG. 4 for driving a power semiconductor switch comprises a power semiconductor switch $M_1$, the load path D-S of which, as in the circuit shown in FIG. 1, is connected between a supply potential terminal having the supply potential $V_{DD}$ and an output OUT. The load $R_{LOAD}$ is connected between the output OUT and a reference potential terminal having a reference potential (e.g. ground potential GND). The power semiconductor switch $M_1$ additionally comprises a control electrode G connected to the output of a driver circuit 10. The driver circuit generates a driver signal for driving the control electrode G of the power semiconductor switch $M_1$ in a manner dependent on a control signal ON (cf. diagram 1 in FIG. 3). In addition, the circuit arrangement 1 has a monitoring circuit, which is designed to generate a diagnostic current $I_{DIAG}$ through the load $R_{LOAD}$ and to evaluate the voltage drop $V_{OUT}$ brought about thereby across the load $R_{LOAD}$ before the delay time $t_D$ explained with reference to FIG. 3 has elapsed.

The diagnostic current $I_{DIAG}$ can be generated for example by a controlled current source 20 that is part of the monitoring circuit. The current source 20 can be connected in parallel with the load path D-S of the semiconductor switch $M_1$ and can be driven for example by a load monitoring logic circuit 30 in such a way as to activate the current source with the current $I_{DIAG}$ after a level change in the control signal ON (which initiates a switch-on operation of the semiconductor switch $M_1$).

The voltage $V_{OUT}$ which is dropped across the load $R_{LOAD}$ and is brought about by the diagnostic current $I_{DIAG}$ can also be evaluated with the aid of the logic circuit 30. Two comparators 50 and 51 can be provided for this purpose, both of which are connected by one of their inputs to the output OUT of the circuit arrangement 1. The first threshold value $V_{LO}$ and the second threshold value $V_{HI}$ can be respectively fed to another input of the comparators 50 and 51. The outputs of the comparators 50 and 51 are connected to the logic circuit 30, which is designed to decide whether the voltage drop $V_{OUT}$ across the load is situated within the interval $[V_{LO}, V_{HI}]$.

The evaluation of the voltage $V_{OUT}$ must be effected within a diagnostic time period $t_{DIAG}$, as has already been explained with reference to FIG. 3. The diagnostic time period $t_{DIAG}$ can be fixedly predetermined for the logic circuit 30 by a timer circuit, for example, which is controlled e.g. by the control signal ON. Depending on the result of the evaluation of the voltage $V_{OUT}$, the logic circuit 30 can signal the presence of an excessively low load and an excessively high load at a first output DLO and a second output DHO, respectively. By way of example, a short circuit and an excessively high load resistance after the delay time $t_D$ has elapsed can be signaled by a corresponding logic level (e.g. high level) at the output DLO and at the output DHO, respectively.

The control signal ON for the driver circuit 10 is generated by an ON/OFF logic drive circuit 40, for example. For this purpose, an external control signal $ON_{EXT}$ and a switch-off signal LO_OFF can be fed to the drive logic. During normal operation (that is to say when the resistance $R_{LOAD}$ of the load is in the permissible range), the control signal ON corresponds to the external control signal $ON_{EXT}$. If a short circuit is identified by the logic circuit 30, the immediate switching off of the power semiconductor switch $M_1$ can be initiated by the switch-off signal LO_OFF generated by the logic circuit 30. In the simplest case, the drive logic 40 can comprise an AND gate that ANDs the signals on $ON_{EXT}$ and $LO_{OFF}$. This emergency switching off will be explained in more detail below with reference to FIG. 6.

The circuit arrangement 1 illustrated in FIG. 5 differs from the circuit arrangement in FIG. 4 by virtue of the fact that the current source 20 is replaced by a second transistor $M_2$ and an associated driver circuit 10'. In this case, the transistors $M_1$ and $M_2$ can be arranged in the same cell array CA of a power transistor arrangement. In this case, the load path of the second transistor $M_2$ can be connected in parallel with the load path of the power semiconductor switch $M_1$, in which case a series resistor $R_S$ for current limiting may additionally be provided in series with the load path of the second transistor $M_2$ if the load path resistance of the transistor $M_2$ is not sufficient by itself for this. In a manner similar to the power semiconductor switch $M_1$, the second transistor $M_2$ is driven by a driver circuit 10', which is once again fed a control signal generated by the logic circuit 30. The function of the current source 20 in accordance with FIG. 4 is performed by the transistor $M_2$ and the driver circuit 10' in this example. Through the arrangement of the second transistor $M_2$ in the same cell array of the transistor $M_1$, this example of the invention can be realized in a particularly space-saving manner. Since the diagnostic current through the second transistor $M_2$ is significantly lower than the nominal value $I_{NOM}$ of the load current $I_{OUT}$ through the power semiconductor switch $M_1$, the second $M_2$ can comprise significantly fewer transistor cells than the power semiconductor switch $M_1$. For this reason, the capacitance of the control electrode of the second transistor $M_2$ is significantly lower, which in turn permits rapid switching of the diagnostic current through the second transistor $M_2$.

Figure 6:
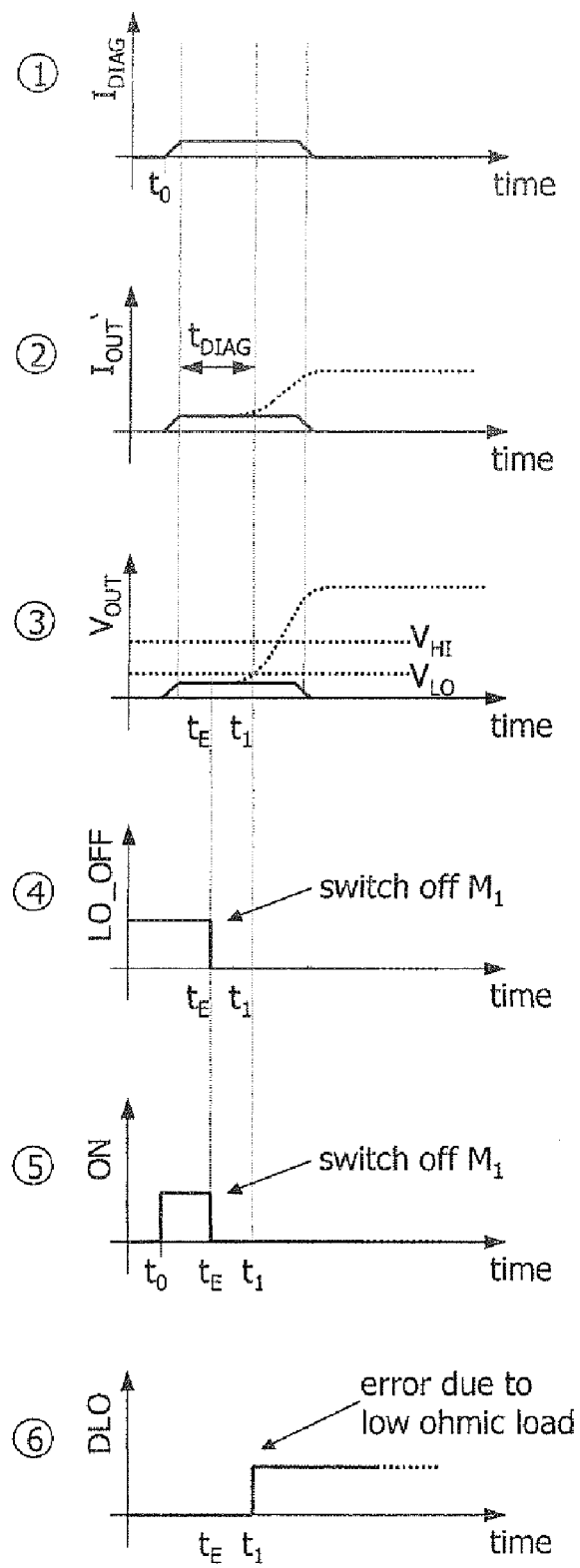
FIG. 6 illustrates, on the basis of timing diagrams, the functioning of the circuit arrangements of FIG. 4 and FIG. 5 for the case of an excessively small load voltage.

FIG. 6 illustrates, on the basis of timing diagrams, the functioning of the circuit arrangements of FIG. 4 and FIG. 5 for the case of an excessively small load voltage (e.g. short circuit in the load). Diagram 1 in FIG. 6 shows the diagnostic current profile such as has already been illustrated in diagram 3 of FIG. 3. Diagram 2 of FIG. 6 shows the resulting total current $I_{out}'$ through the load, and diagram 3 of FIG. 6 shows the voltage $V_{OUT}$ brought about thereby at the load. The dotted lines show that signal profile which would be established if the resistance $R_{LOAD}$ of the load were in a permissible range. Assuming that the evaluation of the voltage $V_{OUT}$ is effected by the logic circuit 30 and the comparators 50 and 51 (cf. FIGS. 4 and 5) at an instant $t_E$ which precedes the instant $t_1$, then the logic circuit 30, with the aid of the comparator 50, identifies an excessively low load resistance $R_{LOAD}$ and an imminent overheating of the circuit arrangement 1. In order to prevent this, the switch-off signal LO_OFF (diagram 4 of FIG. 6) is set from a high level to a low level, which results in a switching off of the semiconductor switch $M_1$ since the control signal ON is thereby reset correspondingly (diagram 5 of FIG. 6). After the time interval $t_{DIAG}$ has elapsed or after the delay time $t_D$ has elapsed, a disturbance (that is to say an excessively low load resistance $R_{LOAD}$ at the output OUT of the circuit arrangement) is signaled by the logic circuit 30 at the output DLO thereof (diagram 6 of FIG. 6).

By virtue of the switching off the semiconductor switch $M_1$ that is instigated in a timely fashion with the aid of the monitoring circuit, an overheating of the semiconductor body in which the circuit arrangement is integrated may be effectively prevented since the control electrode G of the semiconductor switch $M_1$ is discharged again before the semiconductor switch $M_1$ can fully turn on and assume a low-resistance state.

The invention claimed is:

1. A method for monitoring a load driven by a power semiconductor switch, comprising:
   driving a control electrode of the power semiconductor switch, in such a way that a rise in a load current through the power semiconductor switch is effected after a delay time;
   generating a diagnostic current flowing through the load, wherein the diagnostic current brings about a voltage drop across the load before the delay time has elapsed; and
   evaluating the voltage drop across the load before the delay time has elapsed.

2. The method as claimed in claim 1, wherein evaluating the voltage drop comprises:
   comparing the voltage drop across the load with a first threshold value before the delay time has elapsed.

3. The method as claimed in claim 2, wherein evaluating the voltage drop further comprises:
   comparing the voltage drop across the load with a second threshold value before the delay time has elapsed.

4. The method as claimed in claim 2, wherein evaluating the voltage drop further comprises:
   generating a signal responsive to the voltage drop across the load not exceeding the first threshold value.

5. The method as claimed in claim 3, wherein evaluating the voltage drop ($V_{out}$) further comprises:
   generating a signal responsive to the voltage drop across the load exceeding the second threshold value.

6. The method as claimed in claim 1, wherein the diagnostic current is smaller than a nominal value of the load current.

7. The method as claimed in claim 1, further comprising:
   responsive to the voltage drop being evaluated as excessively low, switching the power semiconductor switch.

8. The method of claim 7, wherein switching off the power semiconductor is performed prior to the load current reaching a nominal value that would otherwise be reached if the load current were not excessively low.

9. A circuit arrangement for driving a power semiconductor switch, comprising:
   the power semiconductor switch connected to a load and having a load path connected in series with the load, and further having a control electrode;
   a driver circuit connected to the control electrode and configured to drive the control electrode depending on a control signal in such a way that a delay time elapses between the application of a driver signal to the control electrode and a rise in a load current through the load path of the power semiconductor switch; and
   a monitoring circuit configured to generate a diagnostic current through the load and evaluate a voltage drop across the load before the delay time has elapsed.

10. The circuit arrangement as claimed in claim 9, wherein the monitoring circuit comprises:
    a current source configured to selectively generate the diagnostic current in response to a control input.

11. The circuit arrangement as claimed in claim 9, wherein the monitoring circuit comprises:
    a transistor having a load path connected in series with the load and configured such that the diagnostic current flows through the load path of the transistor.

12. The circuit arrangement as claimed in claim 11, wherein the power semiconductor switch and the transistor are formed in a same cell array.

13. The circuit arrangement as claimed in claim 9, wherein the monitoring circuit comprises:
    a first comparator configured to compare the voltage drop across the load with a first threshold value, the first comparator having an output at which a result of the comparison with the first threshold value is available.

14. The circuit arrangement as claimed in claim 13, in which the monitoring circuit furthermore comprises:
    a second comparator configured to compare the voltage drop across the load with a second threshold value, the second comparator having an output at which a result of the comparison with the second threshold value is available.

15. The circuit arrangement as claimed in claim 14, further comprising a logic circuit configured to receive the outputs of the comparators and to generate a signal based on the comparison results of the first and second comparators.

16. The circuit arrangement as claimed in claim 9, further comprising:
    a drive logic circuit configured to receive the control signal and to activate and deactivate the driver circuit depending on the control signal.

17. The circuit arrangement as claimed in claim 9, wherein the power semiconductor switch is one of a metal-oxide semiconductor field-effect transistor (MOSFET) and an insulated-gate bipolar transistor (IGBT).

18. The circuit arrangement as claimed in claim 9, wherein the power semiconductor switch is configured in the circuit arrangement as a low-side switch.

19. The circuit arrangement as claimed in claim 9, wherein the power semiconductor switch is configured in the circuit arrangement as a high-side switch.

20. The circuit arrangement of claim 11, wherein the transistor has a control electrode having a lower capacitance than the control electrode of the power semiconductor switch.

21. An apparatus configured to drive a power semiconductor switch having a load path in series with a load, the apparatus comprising:
    a first circuit configured to generate a voltage rise in a first signal at a control electrode of the power semiconductor switch, the voltage rise causing the load path of the power semiconductor switch to conduct after a delay from a beginning of the voltage rise; and
    a second circuit configured to generate a diagnostic current through the load and to evaluate a voltage drop across the load that occurs at a time prior to the delay expiring.

22. The apparatus of claim 21, wherein the diagnostic current is 10 mA or less.

23. The apparatus of claim 21, wherein the second circuit is further configured to cause the first signal to drop in voltage responsive to the evaluated voltage drop being less than a threshold value.

* * * * *